United States Patent [19]
Takenouchi

[11] Patent Number: 5,332,972
[45] Date of Patent: Jul. 26, 1994

[54] GRADIENT MAGNETIC FIELD GENERATOR FOR MRI SYSTEM

[75] Inventor: Eisuke Takenouchi, Tochigi, Japan

[73] Assignee: Kabushiki Kaisha Toshiba, Kawasaki, Japan

[21] Appl. No.: 878,824

[22] Filed: May 5, 1992

[30] Foreign Application Priority Data

May 9, 1991 [JP] Japan .................................. 3-104449

[51] Int. Cl.⁵ .............................................. G01V 3/00
[52] U.S. Cl. ...................................... 324/318; 335/219
[58] Field of Search ............... 324/300, 307, 308, 309, 324/310, 311, 312, 313, 314, 318, 322; 335/219; 128/653.2, 653.5

[56] References Cited

U.S. PATENT DOCUMENTS

| | | | |
|---|---|---|---|
| 4,411,270 | 10/1983 | Damadian | 324/309 |
| 4,617,516 | 1/1986 | Schenck | 324/318 |
| 4,636,729 | 1/1987 | Maurer et al. | 324/318 |

Primary Examiner—Michael J. Tokar
Attorney, Agent, or Firm—Limbach & Limbach

[57] ABSTRACT

Disclosed is a gradient magnetic field generator for an MRI system including a bobbin, formed of a non-magnetic body, being shaped into an appoximate hollow cylinder, and gradient coils embedded in the bobbin for generating gradient magnetic fields with supplied currents. The bobbin is formed such that thickness of the axial central portion of the bobbin is thicker than that of the axial end portions for enhancing the rigidity on the axial central portion.

21 Claims, 9 Drawing Sheets

5,332,972

GRADIENT MAGNETIC FIELD GENERATOR FOR MRI SYSTEM

BACKGROUND OF THE INVENTION

The present invention relates to a gradient magnetic field generator in an MRI (Magnetic Resonance Imaging) system using an NMR (Nuclear Magnetic Resonance) phenomenon, and more specifically, to the improvement in reducing noise caused by pulsed electromagnetic forces exerted on gradient coils.

It is well known that a medical MRI system includes a bed device for putting a patient thereon, a magnet device for forming a static magnetic field, a transmitter-receiver for transmitting a high frequency wave for generating magnetic resonance to the patient and for receiving an MR signal from the patient to detect and amplify the MR signal, a gradient magnetic field generator for discriminating the position of the MR signal and a processor-controller for controlling the entire system and reconstructing the image.

The gradient magnetic field generator has a gradient coil unit and a gradient magnetic field power supply. The gradient coil unit comprises three groups of coils commonly called as x-coils, y-coils and z-coils for forming gradient magnetic fields linearly changed in their intensities in respective coordinate directions, with supplied pulse currents from the gradient magnetic field power supply.

One type of the gradient coil unit is formed by mechanically fixing a plurality of x-coils, y-coils and z-coils to be paired with respect to the Z-direction (i.e. the longitudinal direction of the unit), respectively, on the outer peripheral side of a bobbin made of a fiber reinforced composite material (hereinafter referred to as FRP) impregnated with non-magnetic resin. Also, another type of the gradient coil unit is formed by winding x-coils, y-coils and z-coils on the outer peripheral surface side of an internal cylinder made of FRP, surrounding the outside thereof by another cylinder made of FRP, and impregnating the gap between the two cylinders with resin into an integrated structure, thereby winding the x-coils, y-coils and z-coils in the state of embedding them within a bobbin.

The gradient magnetic field power supply is to be a pulse current source for supplying a pulse current with a pulse of a several millseconds in its first and last transitions to x-coils, y-coils and z-coils through operation of a processor-controller.

Such MRI system as mentioned above has been disadvantageous in that, as a pulse current is applied from the gradient magnetic field power supply to the x-coils, y-coils and z-coils in a static magnetic field, the coils (such as flat lead wires) receive pulsed eletromagnetic forces in various directions, which causes the deflection of the bobbin resulting in the generated noise.

In order to reduce the noise, there has been proposed such a technique that a sound absorption material is wound on the outer peripheral side of the gradient coil unit, or is inserted between a superconductive magnet as a magnet device and a frame cover. However, in the coil attachment structure of the above mentioned gradient coil unit, the coil attachment is restricted so as not to increase the rigidity, and also the gradient coil unit itself is low in its rigiditiy. Therefore, the noise generating energy is left as being high, and also if being absorbed by a sound absorption material, sound components not to be absorbed and to be leaked are left. They are transferred to patients in a diagnostic dome as non-continuation sound of about 70 to 80 phons, thus still bringing inhospitable feeling on the patients.

Another technique for reducing the noise is that prefabricated saddle-shaped x-coils and y-coils and ring-shaped z-coils are rigidly combined by using support elements to form a coil basket and the coil basket is supported via insulating elastic support elements on a hollow cylindrical body. However, forming the coil basket and attaching the coil basket to the hollow cylindrical body via the elastic support elements leads to increased size of the gradient coil unit in the radial direction and increasd assembly time.

SUMMARY OF THE INVENTION

Accordingly, it is a primary object of the present invention to provide a gradient magnetic field generator for an MRI system by which generation of noise caused by electromagnetic forces exerted on gradient coils can be reduced to hence relieve the inhospitable feeling of patients in a diagnostic dome.

It is another object of the present invention to provide a gradient magnetic field generator for an MRI system in which only the form of a bobbin is changed to reduce noise, without the need of complicating the whole structure of a magnetic unit.

These and other objects can be achieved according to the present invention, in one aspect by providing a gradient magnetic field generator for a magnetic resonance imaging system comprising a bobbin formed of a non-magnetic body and formed into a hollow cylindrical shape having inner and outer peripheral surfaces extending in an axial direction of the bobbin and having a certain thickness in a radial direction of the bobbin and gradient coils embedded in the bobbin for generating gradient magnetic fields with supplied currents, wherein the thickness of the bobbin is formed to be larger on an axial central portion than on axial end portions.

Preferably, at least one of the inner and outer peripheral surfaces has a protruding portion protruded on the axial central portion. The protruding portion has the thickness which is continuously or steppedly increased as nearing from the axial end portions to the axial central portion. The gradient coils comprise x-coils, y-coils and z-coils corresponding to a coordinate system of X-, Y- and Z-axes when the axial direction of the bobbin is set to be the Z-direction. Further, the bobbin is impregnated with epoxy resin and the x-coils, y-coils and z-coils are placed at predetermined positions in the epoxy resin.

In the bobbin thus constructed, three groups of gradient coils (a plurality of x-coils, y-coils and z-coils) form gradient magnetic fields in X, Y and Z-directions, respectively. When pulse currents are applied to the x-coils, y-coils and z-coils, respective lead wires of the coils are exerted with electromagnetic forces, to thereby cause the total moment in such a direction as bending the central portion of the bobbin. However, the central portion of the bobbin is thicker in its wall thickness and hence is high in rigidity, so that the deflection of the bobbin caused by the bending moment can be suppressed. The mechanical deflection of the bobbin is therefore certainly suppressed, resulting in the reduced noise. Furtheremore, it can be achieved only by changing the axial thickness of the bobbin, and consequently needs the only simple arrangement without complicating the whole construction of the magnet. Also, since the bobbin is thinner on the end portions less liable to suffer from defflection than on the central portion, the total thickness is minimized as required, thereby preventing the weight thereof from being increased uselessly.

Preferably, the protruding portion is integratedly formed on the outer peripheral surface and is constituted of a plurality of continuous protruding stripes having heights being gradually increased as nearing from the axial end portions to the axial central portion. A plurality of the protruding stripes are shaped into a waveform in cross section taken along the radial direction of the bobbin. Further, the gradient coils comprise x-coils, y-coils, and z-coils. Further, the protruding direction of the protruding stripes is specified to be the Y-direction.

As a result, it can be achieved to reduce noise as mentioned above, to enhance heat radiating effect of the bobbin, and to save the material thereof.

BRIEF DESCRIPTION OF THE DRAWINGS

The accompanying drawings which are incorporated in and constitute a part of this specification, illustrate embodiments of the present invention and, together with the description, serve to explain the principles of the present invention, in which.

DESCRIPTION OF THE PREFERRED EMBODIMENTS

Hereinafter, the exemplary embodiments will be described.

FIRST EMBODIMENT

The first embodiment will be described with respect to FIGS. 1 to 6.

Figure 1:
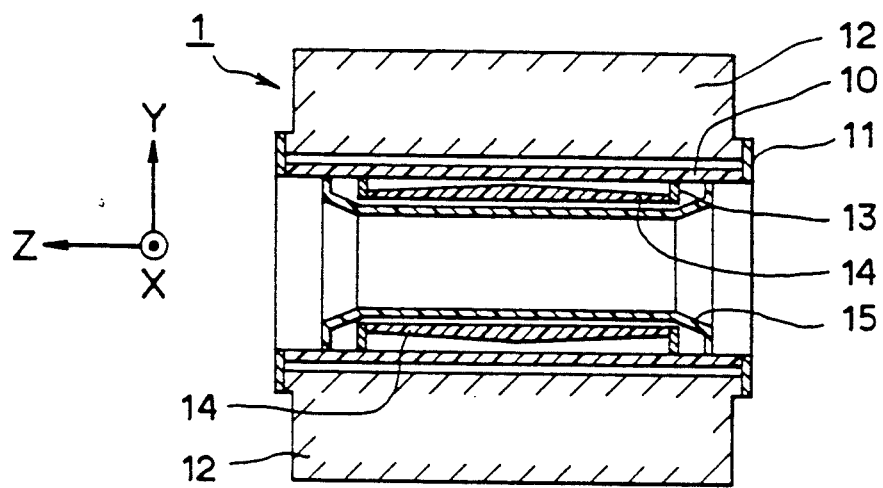
FIG. 1 is a schematic cross sectional view showing the whole construction of a magnet device including a gradient magnetic field generator of a first embodiment.

Referring now to FIG. 1, a magnet device 1 for an MRI system includes a cylindrical dome 10 made of a non-magnetic body. A superconductive magnet 12 for forming a static magnetic field is disposed on the outer peripheral surface side of the dome 10 through metal fittings 11. Also, a gradient coil unit 14 being approximately cylindrical in its whole shape is mounted on the inner peripheral surface of the dome 10 through metal fittings 13. Moreover, on the inner peripheral surface of the dome 10, there is rigidly formed a whole body (WB) coil 15 for detecting a magnetic resonance signal of the object to be detected with fittings (not shown) in such a way as to surround the gradient coil unit 14. In this case, the dome 10 may be eliminated by directly attaching the gradient coil unit 14 on a frame located on the inner peripheral side of the superconductive magnet 12, and also attaching the WB coil 15 on the gradient coil unit 14 or on a frame of the superconductive magnet 12.

Figure 2:
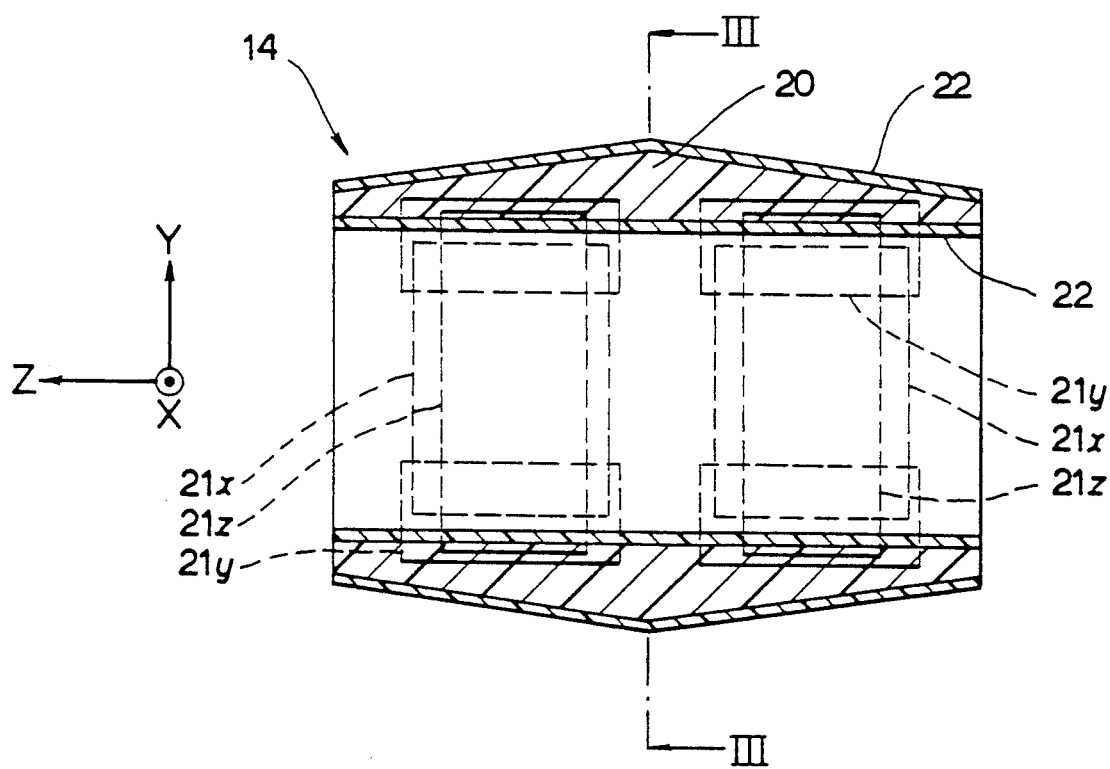
FIG. 2 is an axial cross sectional view of a gradient coil unit of the gradient magnetic field generator of the first embodiment.
Figure 3:
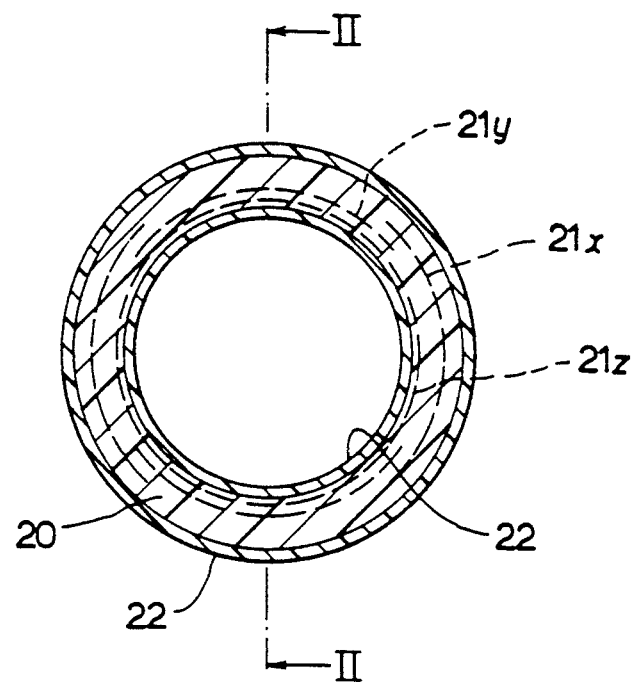
FIG. 3 is a cross sectional view taken along III—III line in FIG. 2.

As shown in FIGS. 2 and 3, the above gradient coil unit 14 made of a non-magnetic body includes a bobbin 20 as a spool being approximately cylindrical in its whole shape, and gradient coils wound in the state of being embedded within the bobbin 20, that is, x-coils $21x \ldots 21x$, y-coils $21y \ldots 21y$, and z-coils $21z$ and $21z$.

The bobbin 20 is formed into an approximate hollow cylinder shape having a wall whose thickness changes along its axial direction. The inner peripheral surface straightly extends and holds the same radius along the axial (z-axis) direction. Both of the axial end portions of the bobbin 20 have a specified wall thickness. The outer peripheral surface of the bobbin 20 forms a protruding portion, which is integrated with a main body of the bobbin 20, by gradually and continuously increasing the wall thickness as nearing from both axial end portions to the axial central portion. The bobbin 20 is formed disposing the coils $21x \ldots 21z$ at the specified positions within a preset mold, respectively, and allowing them to be impregnated with non-magnetic impregnating agent such as epoxy resin.

Incidentally, the inclination of the outer peripheral surface of the bobbin 20 is determined based on the result of the analysis for the magnitudes and directions of the electromagnetic forces exerted on the coils $21x \ldots 21z$ located at respective position within the bobbin 20 when the coils $21x \ldots 21z$ are applied with pulse currents thereby forming gradient magnetic fields.

The bobbin 20 in this embodiment is sticked with reinforced sheets made of a non-magnetic body such as CFRP (Carbon Fiber Reinforced Plastic) 22 and 22 on the inner and outer peripheral surfaces, respectively.

The gradient coils $21x \ldots 21x$, $21y \ldots 21y$, and $21z$ and $21z$ form three groups being paired by a plurality of coils in X, Y, and Z-directions, respectively. One group of coils $21x$ and $21x$, $21y$ and $21y$, and $21z$ are insulatedly embedded in an axial one-half side of the bobbin 20, while the other group of coils $21x$ and $21x$, $21y$ and $21y$, and $21z$ are insulatedly embedded in the axially opposed half side of the bobbin 20, as shown in FIGS. 2 and 3. These gradient coils $21x \ldots 21z$ are connected with a gradient magnetic field power supply (not shown) constituting a part of a gradient magnetic field generator together with the gradient coils, respectively, and are supplied with pulse currents according to a controlled command from a central control unit (not shown).

The function of the first embodiment will be described below.

As pulse currents are supplied with specified sequences from the gradient magnetic field power supply to the gradient coils 21x . . . 21z, the adjacent coils in the axial (Z-axis) direction generate the magnetic fluxs reversed in phase to each other, and the adjacent coils in the X and Y-directions generate the magnetic fluxs identical in phase to each other, thereby forming gradient magnetic fields in X, Y and Z-directions. The gradient magnetic fields are superposed to a static magnetic field formed by the superconductive magnet 12, to form the total magnetic field for diagnosis.

Figure 4:
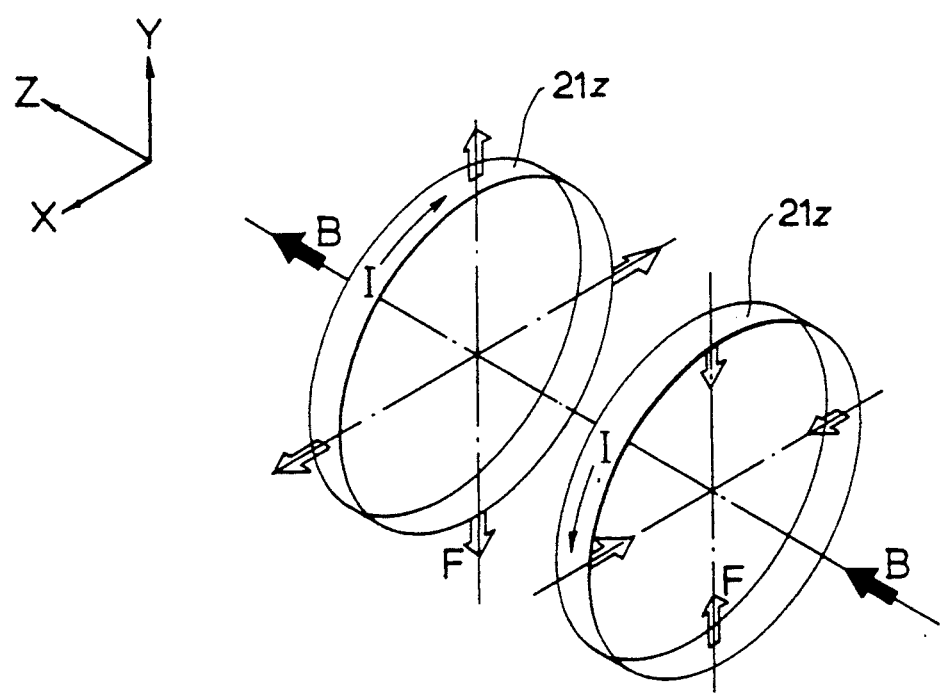
FIG. 4 is a view explanating the directions of electromagnetic forces exerted on z-coils of the first embodiment.
Figure 5A:
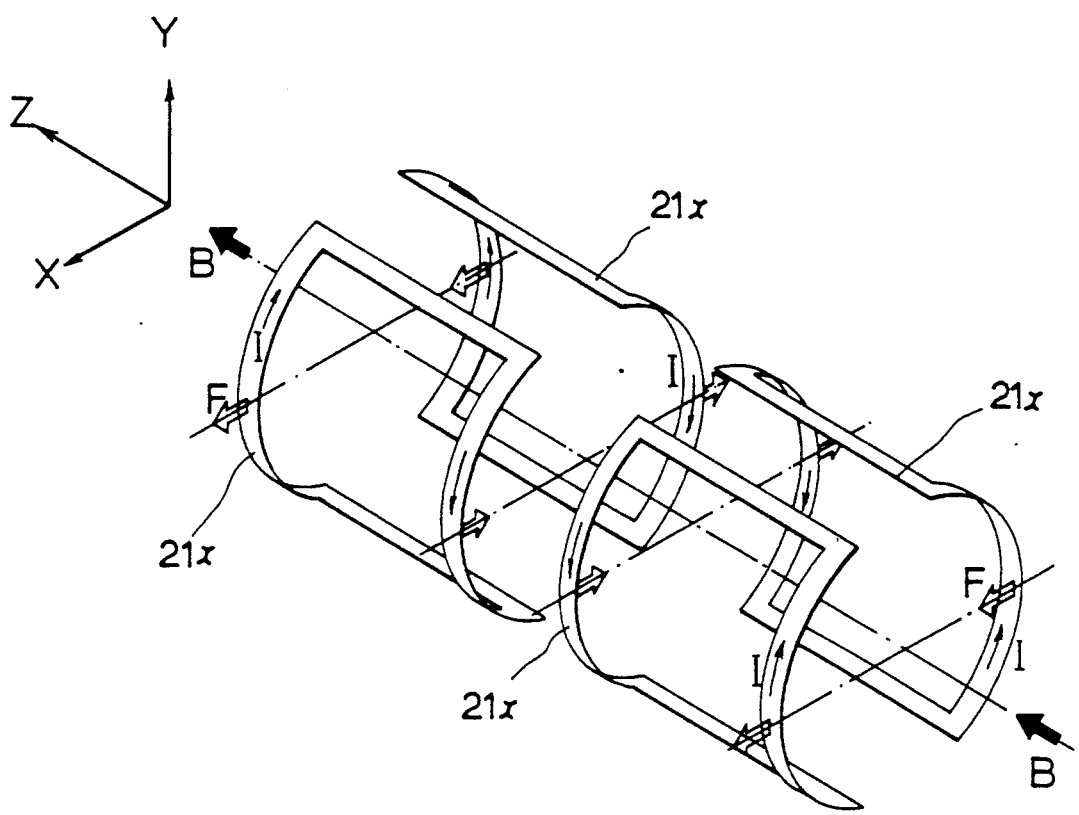
FIG. 5A is a view explanating the directions of electromagnetic forces exerted on x-coils of the first embodiment.
Figure 5B:
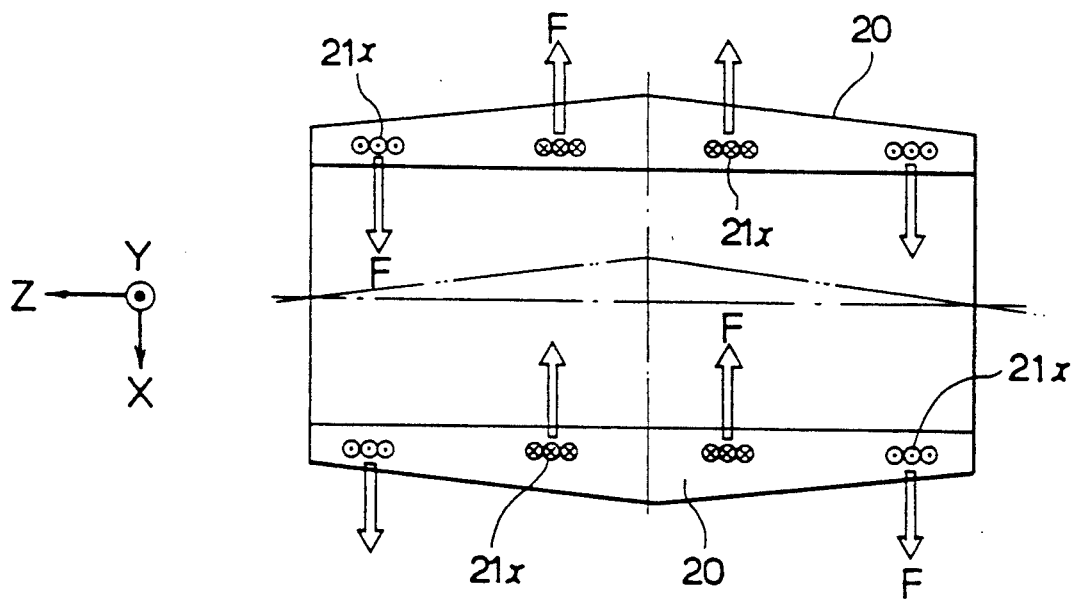
FIG. 5B is a view explanating the deflected direction of a bobbin caused by electromagnetic forces exerted on x-coils.
Figure 6:
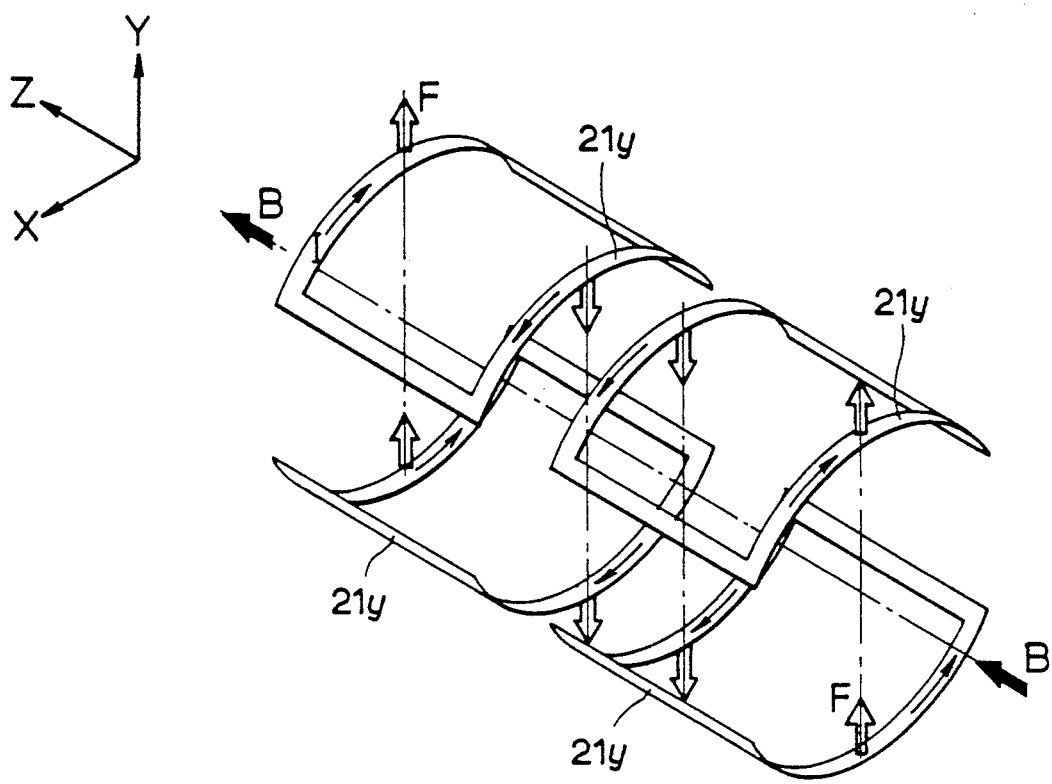
FIG. 6 is a view explanating the directions of electromagnetic forces exerted on y-coils of the first embodiment.

Referring to FIGS. 4 to 6, there will be described electromagnetic forces exerted to the coils 21x . . . 21z in formation of the gradient magnetic fields. In these figures, a reference numeral B shows the static magnetic field formed by the superconductive magnet 12. As a pulse current I is applied to lead wires of the coils 21x . . . 21z in the static magnetic field B, each lead wire receives electromagnetic force F (proportional to the magnitudes of the static magnetic field B and the current I) in the direction determined by the directions of the static magnetic field B and the current I.

For example, in the case of the z-coils 21z and 21z, the electromagnetic force F is generated in such a direction as shown in FIG. 4, so that the z-coils 21z and 21z receive the forces deflected in the inner and outer peripheral directions, respectively. The x-coils 21x . . . 21x receive electromagnetic forces generated in such directions as shown in FIG. 5A. Namely, the lead wire pieces in the central portion receive the electromagnetic forces in the minus X-direction, respectively, while the lead wire pieces in the end portions receive the electromagnetic forces in the plus X-direction, respectively.

Thus, as shown in FIG. 5B, the bending moment of the electromagnetic forces F . . . F is exerted to the x-coils 21x . . . 21x, as a result of which, assuming that both of the axial end portions are fixedly supported, the central portion of the bobbin 20 integratedly receives such a force as to deflect the bobbin 20 upwardly(in the minus X-directon), as shown by a two-dotted line in FIG. 5B. Furthermore, in the case of the y-coils 21y . . . 21y, as shown in FIG. 6, the electromagnetic forces are exerted thereto in the identical direction to that obtained by rotating the x-coils 21x . . . 21x by 90 degrees with respect to the z axis. Incidentally, it is confirmed that the electromagnetic forces (namely, noise) caused by the x-coils 21x . . . 21x are larger than those caused by the y-coils 21y . . . 21y and z-coils 21z and 21z.

As mentioned above, the elctromagnetic forces F . . . F exerted to the all of coils 21x . . . 21z are complicatedly synthesized or independently effected, and are liable to cause the maximum deflection at the central portion of the bobbin 20. However, in this embodiment, the wall thickness of the bobbin 20 is gradually increased as nearing the central portion so as to enhance the rigidity of the central portion compared with the conventional one, so that the whole deflection of the bobbin 20 caused by the electromagnetic forces F . . . F can be certainly suppressed, thereby certainly reducing the intensity in noise.

Therefore, differently from the conventional passive noise reducing measure wherein the generated noise is absorbed by means of a sound absorption material, the noise transferred to patients is remarkably suppressed thereby extremely reducing inhospitable feeling. Meanwhile, this embodiment is characterized by changing the wall thickness near the central portion of the bobbin 20 according to the condition of generating electromagnetic forces, and consequently the arrangement can be carried out without complicating the construction thereby unaffecting the change in design of the whole magnet device 1. In addition, it is unnecessary to use support elements used in a conventional technique, thereby decreasing the radial size of the gradient coil unit and decreasing assembly time compared with the conventional one.

Furthermore, in consideration of the fact that both the end portions of the bobbin 20 receive a small deflection, the end portions are kept to be thinner. Thus, only the portions requiring larger rigidity are thickened, which excludes the disadvantage of incurring increase in weight and material cost. In addition, according to the form of bobbin 20 of this embodiment, there can be secured a space for a patient on the inner peripheral side.

The primary object of this embodiment is to reduce noise; however, in another viewpoint, by enhancing the rigidity of the bobbin 20, flactuations in position of gradient coils 21x . . . 21z can be suppressed. Thus, there can be obtained the secondary effect of improving the resolution of an MRI diagnostic image.

The above-mentioned bobbin 20 is so constructed that the outer peripheral surfaces is changed in inclination according to its axial position. However, as a result of structual and mechanical analysis, and also in consideration of manufacturing cost, there may be adopted various kind of the modifications as shown in FIGS. 7 to 12.

Figure 7:
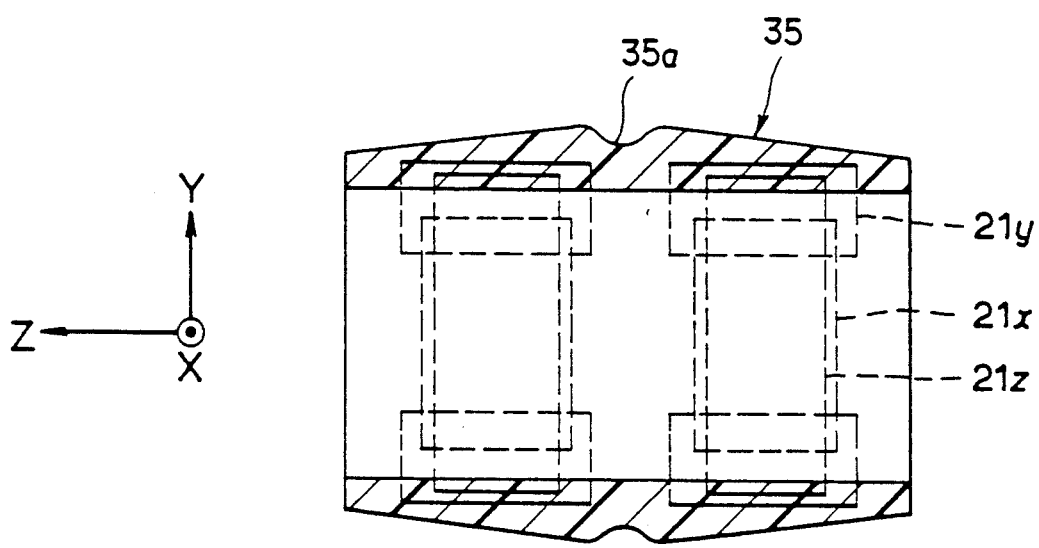
FIGS. 7 to 9 are axial cross sectional views of bobbins shaped in another forms of the first embodiment, respectively.
Figure 8:
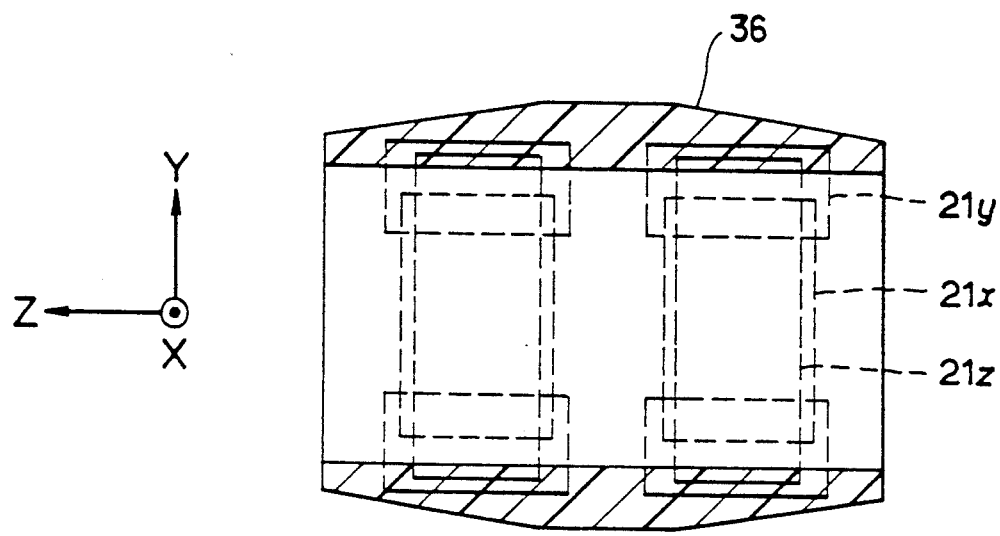
Figure 9:
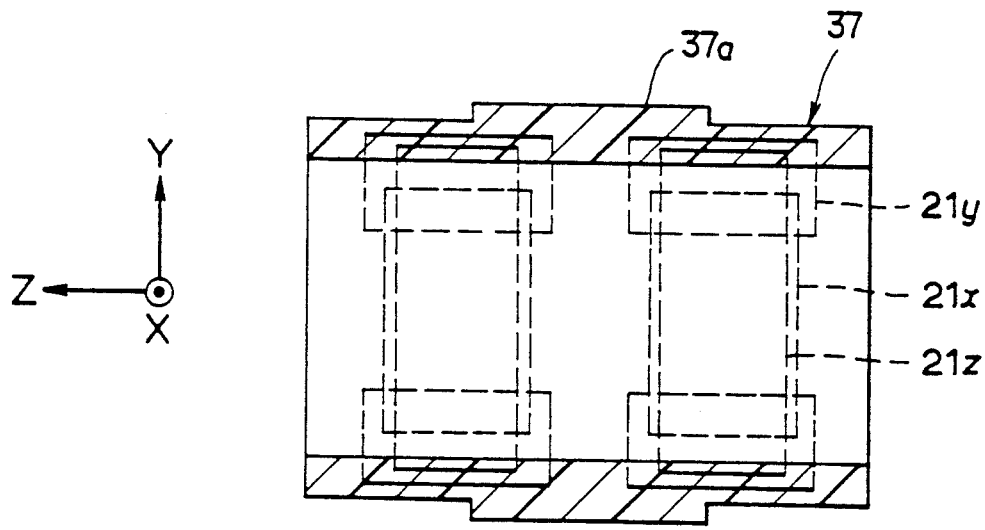

In changing the wall thickness of the outer peripheral surface of the bobbin according to the axial position thereof, the following modifications may be proposed: a bobbin 35 provided with a recess 35a on the outer inclined peripheral surface at the axial central portion as shown in FIG. 7; a bobbin 36 having an axially level portion of the outer inclined peripheral surface at the axial central portion as shown in FIG. 8; and a bobbin 37 provided with a steppedly protruding portion 37a at the axial central portion as shown in FIG. 9.

Figure 10A:
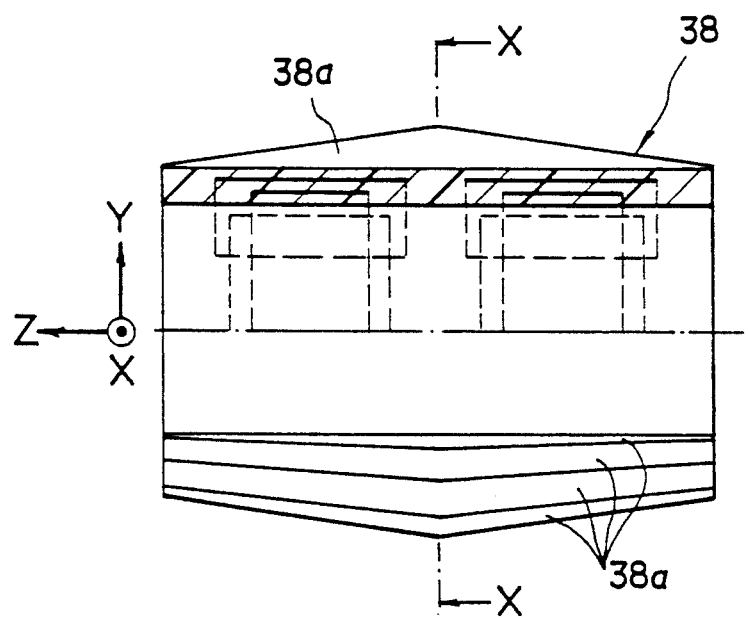
FIG. 10A is an axial cross sectional view taken along X'—X' line in FIG. 10B showing a bobbin shaped in further form of the first embodiment.
Figure 10B:
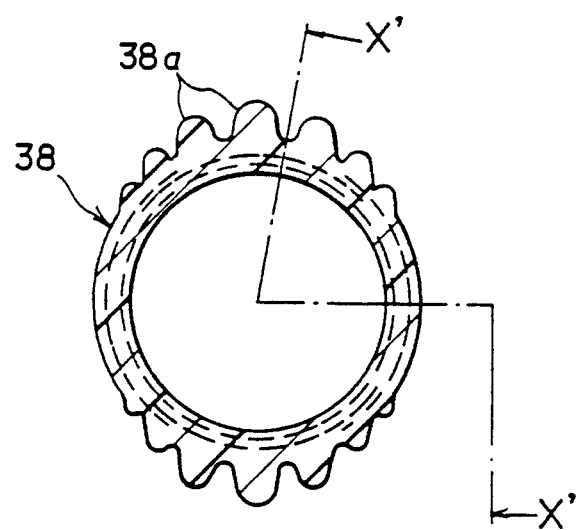
FIG. 10B is a cross sectional view taken along X—X line in FIG. 10A.

Furthermore, a bobbin 38 shown in FIGS. 10A and 10B has such an object as to enhance the rigidity for electromagnetic forces caused by the x-coils 21x . . . 21x. The bobbin 38 has protruding stripes 38a . . . 38a, each having a waveform radial cross section, which are integratedly formed partly on both sides in the Y-direction respectively. The wall thickness of the main body of the bobbin 38 is kept constant in the axial direction, in contrast, the radial thicknesses of the top portions of the protruding stripes 38a . . . 38a are increased as nearing the X-direction central portion of the bobbin 38. Accordingly, in the viewpoint of the whole bobbin, the rigidity of the central portion in the Z-direction is larger than that of axial end portions with respect to the X-direction. Therefore, the deflection of the bobbin 38 caused by the electromagnetic forces of x-coils 21x . . . 21x, which are usually the largest magnitude, can be certainly suppressed, thus remarkably reducing the total noise. Moreover, the bobbin 38 shown in FIGS. 10A and 10B has the outside surface area increased more than that of the simple cylindrical type by adding the protruding stripes 38a . . . 38a, and consequently it is excellent in heat radiation effect, and can be saved in its resin material compared with the cylindrical bobbin having the thickened central portion.

Figure 11A:
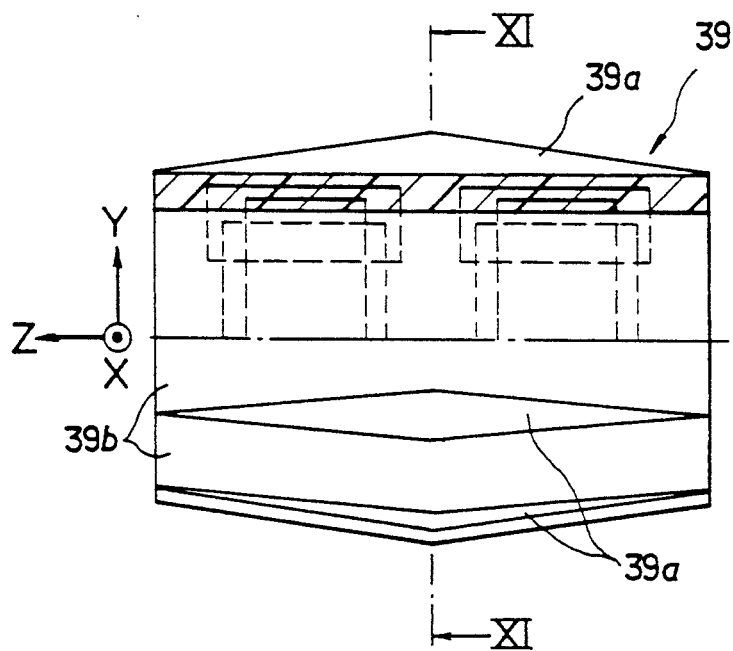
FIG. 11A is an axial cross sectional view taken along XI'—XI' line in FIG. 11B showing a bobbin shaped in still further form of the first embodiment.
Figure 11B:
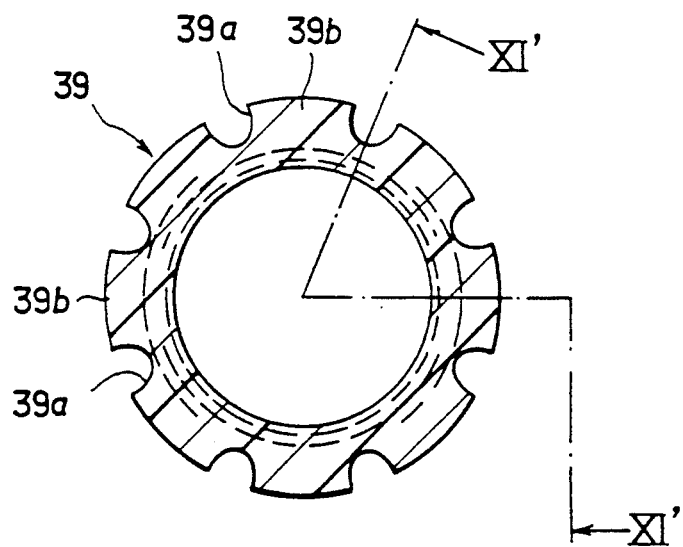
FIG. 11B is a cross sectional view taken along XI—XI line in FIG. 11A.
Figure 12:
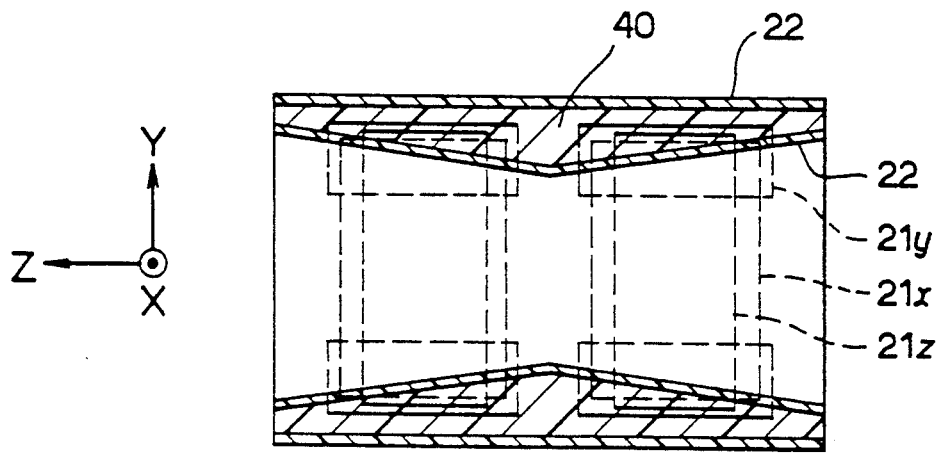
FIG. 12 is an axial cross sectional view of a bobbin shaped in an additional form of the first embodiment.

A bobbin 39 shown in FIGS. 11A and 11B has also such a construction as to further correspond to the electromagnetic forces in the Y-direction. The bobbin 39 is formed to be increased in its wall thickness as nearing the central portion in the Z-direction and to be provided with slits 39a . . . 39a for forming protruding stripes 39b . . . 39b with a specified wall thickness left axially formed on the outer peripheral surface every specified distance in the circumferential direction. With such protruding stripes 39b . . . 39b, it can be achieved to enhance the rigidity for the deflection caused by the electromagnetic forces in the X and Y-directions, and to obtain the same effect as in the above mentioned stripes with respect to the heat radiation and saving of the material.

Against the above mentioned forms, the inner peripheral surface may be changed in inclination along its axial direction. For such modification, there may be adopted a bobbin 40 shown in FIG. 12, wherein the inclination of the inner peripheral surface is increased as nearing the axial central portion while the outer peripheral surface is not inclined along its axial direction.

SECOND EMBODIMENT

The second embodiment will be described with respect to FIGS. 13 and 14, wherein elements similar to those in the first embodiment are denoted by the same reference numerals, and the explanation thereof is simplified or omitted.

Figure 13:
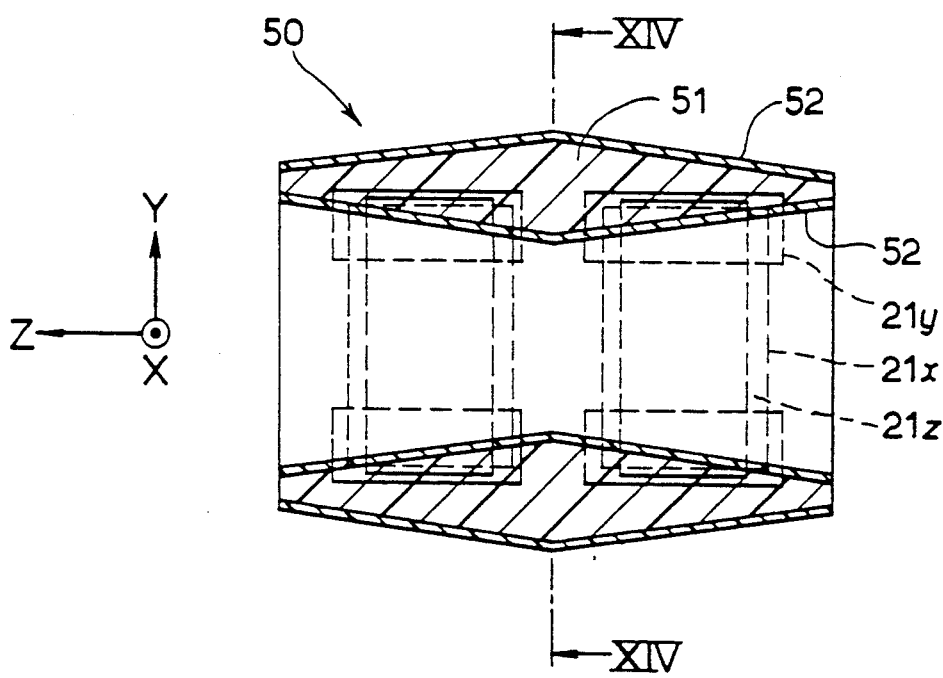
FIG. 13 is an axial cross sectional view of a gradient coil unit of a gradient magnetic field generator of a second embodiment.
Figure 14:
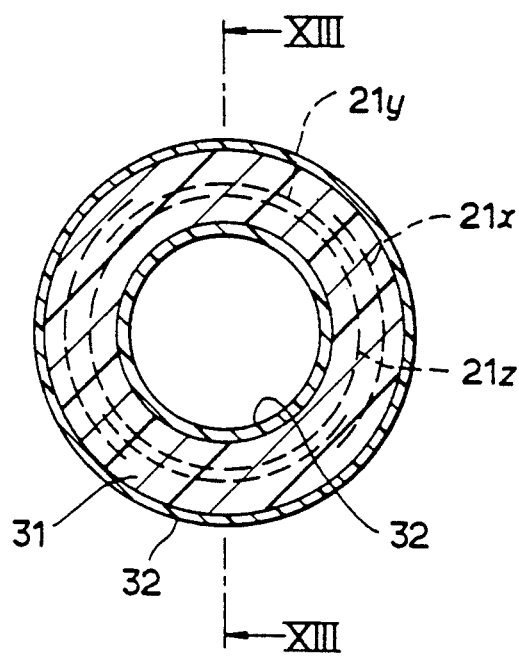
FIG. 14 is a cross sectional view taken along XIV—XIV line in FIG. 13.

A gradient coil unit 50 shown in FIGS. 13 and 14 includes an approximately cylindrical bobbin 51, and gradient coils 21x . . . 21z wound in the state of being embedded within the bobbin 51. The bobbin 51 has an outer peripheral surface formed in a continuously-thickened protruding portion having the top at the axial central portion similarly to the first embodiment, and also has an inner peripheral surface formed in a cone-shape (i.e. protruding portions) symmetric with the outer peripheral surface. Reinforced sheets 52 and 52 are sticked on the inner and outer peripheral surfaces, respectively. The other construction is similar to that in the first embodiment.

According to the second embodiment, it is possible not only to obtain the same functional effect as in the first embodiment, but also to further enhance the rigidity near the central portion of the bobbin 51 which more certainly reduces the intensity in noise caused by the electromagnetic forces, thereby enhancing the noise reducing effect.

Incidentally, in the above embodiments, the reinforced sheets respectively sticked on the inner and outer peripheral surfaces may be eliminated.

What is claimed is:

1. A gradient magnetic field generator for a magnetic resonant imaging system, the generator comprising:
   a bobbin, formed of a non-magnetic material and formed into a substantially hollow cylindrical shape, having radially inner and outer peripheral surfaces, an axial central portion of the bobbin being larger in radial thickness than axial end portions of the bobbin; and
   gradient coils embedded between the inner and outer peripheral surfaces of the bobbin for generating gradient magnetic fields when electric currents are supplied to the gradient coils.

2. A gradient magnetic field generator according to claim 1, wherein said bobbin has a protruding portion formed at the central portion of at least one of the inner and outer peripheral surfaces.

3. A gradient magnetic field generator according to claim 2, wherein said protruding portion has a shape whose radial thickness continuously increases as axial position of the bobbin moves from the axial end portions to the central portion.

4. A gradient magnetic field generator according to claim 2, wherein said protruding portion has a shape whose radial thickness is steppedly increased.

5. A gradient magnetic field generator according to claim 1, wherein said gradient coils comprise x-coils, y-coils, and z-coils corresponding to a coordinate system of X-, Y- and Z-axes when the axial direction of the bobbin is set to the Z-direction.

6. A gradient magnetic field generator according to claim 5, wherein said non-magnetic material is epoxy resin and bobbin is impregnated with the epoxy resin and said x-coils, y-coils and z-coils are placed at predetermined positions in the epoxy resin.

7. A gradient magnetic field generator according to claim 2, wherein said protruding portion is formed on both the inner and outer peripheral surfaces.

8. A gradient magnetic field generator according to claim 2, wherein said protruding portion is formed on the inner peripheral surface.

9. A gradient magnetic field generator according to claim 2, wherein said protruding portion is formed on the outer peripheral surface.

10. A gradient magnetic field generator according to claim 2, wherein said protruding portion is integratedly formed with a main body of the bobbin.

11. A gradient magnetic field generator according to claim 10 wherein said protruding portion is constituted of a plurality of continuous protruding stripes whose radial thickness being gradually increased as axial positions of the bobbin nearing from the axial end portion sot the central portion.

12. A gradient magnetic field generator according to claim 11, wherein said plurality of protruding strips are shaped into an waveform in cross section taken along the radial direction of the bobbin.

13. A gradient magnetic field generator according to claim 12, wherein said gradient coils comprise x-coils, y-coils and z-coils corresponding to a coordinate system of X-, Y- and Z-axes when the axial direction of said bobbin is set to be the Z-direction.

14. A gradient magnetic field generator according to claim 13, wherein said protruding strips is extended along the Y-direction.

15. A gradient magnetic field generator according to claim 12, wherein said protruding strips are partially formed in radial cross section.

16. A gradient magnetic field generator according to claim 11, wherein said plurality of protruding strips are formed by a plurality of slits grooved axially on the outer peripheral surface.

17. A gradient magnetic field generator according to claim 2, wherein said magnetic resonance imaging system adopts a superconductive magnet having a bore in which the gradient magnetic field generator is arranged.

18. A gradient magnetic field generator according to claim 17, wherein said protruding portion has a shape whose radial thickness is continuously increased as axial positions of the bobbin nearing from the axial end portions to the axial central portion.

19. A gradient magnetic field generator according to claim 18, wherein said gradient coils comprise x-coils, y-coils, and z-coils corresponding to a coordinate system of X-, Y- and Z-axes when the axial direction of the bobbin is set to be the Z-direction.

20. A gradient magnetic field generator according to claim 19, further comprising a reinforcement element for the bobbin, the reinforcement element being applied to a least one of the inner and outer peripheral surfaces.

21. A gradient magnetic field generator according to claim 20, wherein said reinforcement element is a reinforced sheet made of non-magnetic material.

* * * * *